US012713548B2

(12) United States Patent
Li et al.

(10) Patent No.: US 12,713,548 B2
(45) Date of Patent: Aug. 18, 2026

(54) SERVER CASE AND SLIDE-TO-UNLOCK HOUSING COVER MECHANISM THEREOF

(71) Applicant: SUZHOU METABRAIN INTELLIGENT TECHNOLOGY CO., LTD., Suzhou (CN)

(72) Inventors: Xiaozheng Li, Suzhou (CN); Jingxian Zhu, Suzhou (CN); Xiuzhong Yin, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 308 days.

(21) Appl. No.: 18/704,033

(22) PCT Filed: Jun. 30, 2022

(86) PCT No.: PCT/CN2022/102604
§ 371 (c)(1),
(2) Date: Apr. 23, 2024

(87) PCT Pub. No.: WO2023/184763
PCT Pub. Date: Oct. 5, 2023

(65) Prior Publication Data

US 2026/0156765 A1 Jun. 4, 2026

(30) Foreign Application Priority Data

Mar. 31, 2022 (CN) ......................... 202210329914.7

(51) Int. Cl.
*H05K 7/14* (2006.01)
*H05K 5/02* (2006.01)
*H05K 5/03* (2006.01)

(52) U.S. Cl.
CPC ............ *H05K 5/03* (2013.01); *H05K 5/0221* (2013.01); *H05K 7/1488* (2013.01)

(58) Field of Classification Search
None
See application file for complete search history.

(56) References Cited

U.S. PATENT DOCUMENTS 6,174,007 B1 * 1/2001 Schlack .................. E05B 13/10 292/DIG. 31
6,616,201 B1 * 9/2003 Liang ..................... E05C 19/08 70/58

(Continued)

FOREIGN PATENT DOCUMENTS

CN 103517595 A 1/2014
CN 108415530 A 8/2018

(Continued)

OTHER PUBLICATIONS

Corresponding International Patent No. PCT/CN2022/102604, International Search Report, Date Mailed Dec. 28, 2022.

(Continued)

*Primary Examiner* — Xanthia C Relford
(74) *Attorney, Agent, or Firm* — Cooper Legal Group, LLC

(57) ABSTRACT

The present application discloses a server case and a slide-to-unlock housing cover mechanism. The slide-to-unlock housing cover mechanism includes cover plate slidably snap-fitted with a housing, a fixing column vertically disposed on the bottom surface of the housing, a through hole formed in the cover plate, a lock shell mounted in the through hole, a handle flipped in the lock shell, an unlocking button mounted in the lock shell in a pressing mode and used for locking the handle, and an unlocking sliding piece slidably disposed in the lock shell and used for performing linear motion driven by a flip of the handle. A sliding direction of the unlocking sliding piece is parallel to a (Continued)

sliding direction of the cover plate, and one end of the unlocking sliding piece is sleeved on the fixing column.

20 Claims, 7 Drawing Sheets

(56) References Cited

U.S. PATENT DOCUMENTS 6,668,602 B2 * 12/2003 Graham ................ H04L 67/306
292/DIG. 31
6,824,174 B2 * 11/2004 Lin ......................... E05C 19/06
292/85
6,929,338 B2 * 8/2005 Chang ..................... G06F 1/181
312/223.2
7,325,846 B2 * 2/2008 Smith ................... E05C 19/006
361/679.55
8,837,129 B2 * 9/2014 Fu ........................ H05K 7/1487
361/679.02
8,991,228 B2 * 3/2015 Yang ..................... E05B 65/006
292/336.3
9,055,689 B2 * 6/2015 Yu ........................ H05K 5/0226
9,207,721 B2 * 12/2015 Conn .................... E05B 65/006
9,380,718 B2 * 6/2016 Wang ................... H05K 5/0221
9,696,769 B1 * 7/2017 Hamilton ................. H05K 5/03
10,619,386 B2 * 4/2020 Chen ..................... E05B 65/006
10,624,223 B1 * 4/2020 Tsorng ................... H05K 5/023
11,229,134 B2 * 1/2022 Chen .................... H05K 7/1487
11,297,730 B1 * 4/2022 Tsorng ................. H05K 7/1402
11,304,322 B2 * 4/2022 Lu ............................ H05K 5/03
12,402,266 B2 * 8/2025 Wu ...................... H05K 7/1487
2004/0021325 A1 * 2/2004 Schlack .................. E05C 1/065
292/110
2004/0222647 A1 * 11/2004 Smith ................... E05C 19/006
292/336.3
2011/0127895 A1 * 6/2011 Conn .................... E05B 65/006
312/294
2014/0001942 A1 * 1/2014 Mao ..................... H05K 7/1487
312/333
2016/0150659 A1 5/2016 Chen et al.

FOREIGN PATENT DOCUMENTS

CN 207700877 U 8/2018
CN 109557982 A 4/2019
CN 110388148 A 10/2019
CN 112367176 A 2/2021
CN 113377166 A 9/2021
CN 114625223 A 6/2022

OTHER PUBLICATIONS

Corresponding International Patent No. PCT/CN2022/102604, Written Opinion, Date Mailed Dec. 28, 2022.
Corresponding Chinese Application No. CN202210329914.7, Notice to Grant, Jun. 26, 2023.

* cited by examiner

SERVER CASE AND SLIDE-TO-UNLOCK HOUSING COVER MECHANISM THEREOF

This application claims priority to Chinese Patent Application No. 202210329914.7, filed on Mar. 31, 2022 in China National Intellectual Property Administration and entitled "Server Case and Slide-to-Unlock Housing Cover Mechanism thereof", which is hereby incorporated by reference in its entirety.

FIELD

The present application relates to a technical field of servers, in particular to a slide-to-unlock housing cover mechanism. The present application further relates to a server case.

BACKGROUND

With development of electronic technology in China, more and more electronic devices have been widely used.

A server is an important component in an electronic device and is a device that provides computing services. Since the server needs to respond to and process service requests, the server should generally have an ability to undertake and guarantee services. The server is divided into a file server, a database server, an application server, a WEB server, and the like according to different types of services provided by the server. Main components of the server include a processor, a hard disk, a memory, a system bus, and the like, similar to a general-purpose computer architecture.

In an era of big data, a large number of Information Technology (IT) devices are placed centrally in data centers. The data centers contain various types of servers, storage, switches, and a large number of cabinets and other infrastructure. Each IT device is composed of various hardware boards, such as a computing module, a storage module, a case, a fan module and the like. The case may be generally divided into a housing and a cover plate. The housing accommodates components such as a main board, and the cover plate performs sealing and protection.

At present, in a process of operation and maintenance of the server, overall design of the server is generally required to achieve dismounting, mounting, and maintenance of the cover plate. Because of relatively high frequency of dismounting and mounting of the cover plate, there are requirements for dismounting and mounting of the cover plate, such as no screws, no tools, and labor-saving.

The traditional cover plate is generally mounted on the housing by an upper cover lock, whereby locking or unlocking between the cover plate and the housing is achieved by the operation of the upper cover lock, thereby achieving the dismounting and mounting operation of the cover plate without screwing.

However, in the traditional technology, the structure of the upper cover lock is relatively complicated, the purchase price is relatively high, and the customer's purchase willingness is not high. But if the upper cover lock is removed, the dismounting and mounting operation is very easy to get stuck since the cover plate is tightly clamped with the housing, and the operation experience is poor. In addition, the upper cover lock is generally provided with a handle in order to facilitate user operation. However, the handle is protruded to be vertically disposed on the surface of the cover plate, thus causing disadvantages that extra space is occupied and overlapping of the server in a cabinet is not facilitated.

Therefore, it is a technical problem faced by those skilled in the art how to simplify the structure, reduce manufacturing costs, and meanwhile, avoid extra space occupation on the basis that cover plate dismounting and mounting operation is conveniently achieved.

SUMMARY

According to an aspect, the present application provides a slide-to-unlock housing cover mechanism, including a cover plate slidably snap-fitted with a housing, a fixing column vertically disposed on the bottom surface of the housing, a through hole formed in the cover plate, a lock shell mounted in the through hole, a handle disposed flipped in the lock shell, an unlocking button mounted in the lock shell in a pressing mode and configured to lock the handle, and an unlocking sliding piece slidably disposed in the lock shell and configured to perform linear motion driven by a flip of the handle. A sliding direction of the unlocking sliding piece is parallel to a sliding direction of the cover plate, and one end of the unlocking sliding piece is sleeved on the fixing column.

In some implementations, a top of the fixing column is elastic, and one end of the unlocking sliding piece is disposed with a clamping hole for forming an elastic clamping fit with the top of the fixing column.

In some implementations, a bottom of the handle is provided with a handle rotating shaft rotationally connected to a side wall of the lock shell, the handle rotating shaft is provided with a gear, and the other end of the unlocking sliding piece is provided with a rack for meshing with the gear.

In some implementations, a support connecting rod is further included. One end of the support connecting rod is rotationally connected to the side wall of the lock shell, and the other end of the support connecting rod is rotationally connected to the bottom of the handle. A sliding hole is formed in the side wall of the lock shell, and the handle rotating shaft is slidably disposed in the sliding hole.

In some implementations, one end of the support connecting rod is provided with a connecting rod rotating shaft rotationally connected to the side wall of the lock shell, and a connecting rod torsion spring for abutting with a bottom of the lock shell to support the handle by an elastic force is sleeved on the connecting rod rotating shaft.

In some implementations, a bottom of the unlocking button is provided with a button rotating shaft rotationally connected to the side wall of the lock shell, and a button torsion spring for abutting with a bottom of the lock shell to spring up the unlocking button by an elastic force is sleeved on the button rotating shaft.

In some implementations, an end of the unlocking button close to the handle is provided with a wedge-shaped portion, and an end of the handle close to the unlocking button is provided with an abutment protrusion for cooperating with the wedge-shaped portion to form an abutment.

In some implementations, the handle is disposed with a via hole, a secondary locking rod is rotatably mounted in the via hole, a bottom of the secondary locking rod is connected to a secondary locking piece for abutting and locking with the bottom surface of the support connecting rod, and the support connecting rod is disposed with a secondary locking hole allowing passage of the secondary locking piece after rotating to a certain angle.

In some implementations, a surface of the unlocking sliding piece is disposed with an annular groove for accommodating the secondary locking piece.

According to another aspect, the present application further provides a server case, including a housing and a slide-to-unlock housing cover mechanism disposed on the housing. The slide-to-unlock housing cover mechanism refers to the slide-to-unlock housing cover mechanism according to any one of the above descriptions.

Details of one or more embodiments of the present application are set forth in the following drawings and description. Other features and advantages of the present application will become apparent from the specification, the drawings and the claims.

BRIEF DESCRIPTION OF THE DRAWINGS

In order to describe embodiments of present application or technical solutions in traditional technology more clearly, drawings required to be used in the embodiments or illustration of the traditional technology will be briefly introduced below. It would be obvious that the drawings in the illustration below are some embodiments of the present application. Those ordinarily skilled in the art also may obtain other drawings according to the provided drawings without creative work.

IN FIG. 1 TO FIG. 12

- 1, housing; 2, cover plate; 3, fixing column; 4, lock shell; 5, handle; 6, unlocking button; 7, unlocking sliding piece; 8, support connecting rod; 9, secondary locking rod; 10, secondary locking piece;
- 41, sliding hole; 51, handle rotating shaft; 52, gear; 53, abutment protrusion; 61, button rotating shaft; 62, button torsion spring; 63, wedge-shaped portion; 71, clamping hole; 72, rack; 73, annular groove; 81, connecting rod rotating shaft; 82, connecting rod torsion spring; 83, secondary locking hole.

DETAILED DESCRIPTION

Technical solutions in embodiments of the present application will be clearly and completely described below with reference to the accompanying drawings in the embodiments of the present application. Obviously, the described embodiments are a part of the embodiments of the present application, rather than all the embodiments. Based on the embodiments of the present application, all other embodiments obtained by those skilled in the art without creative work shall fall within the protection scope of the present application.

Figures 1, 2:
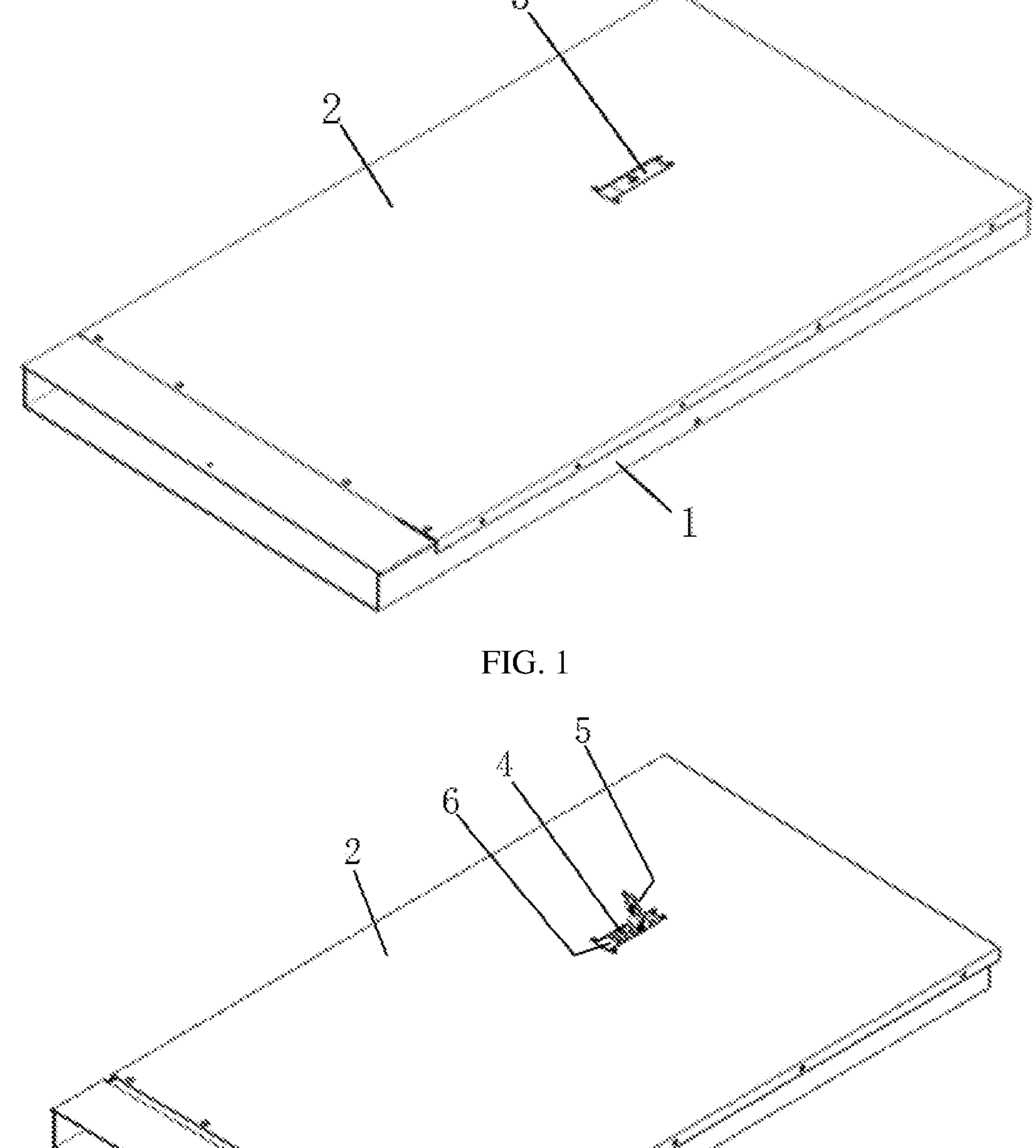
FIG. 1 is a schematic structural diagram of a cover plate in a snap-fitted state according to an implementation of the present application.
FIG. 2 is a schematic structural diagram of the cover plate in an open state according to another implementation of the present application.
Figure 3:
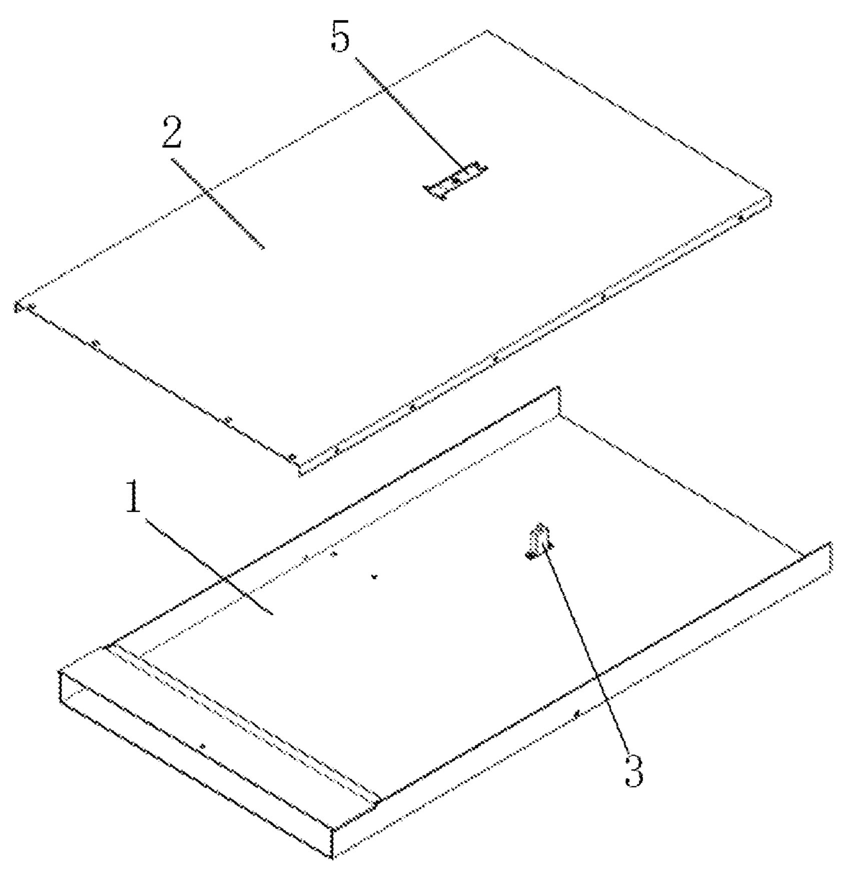
FIG. 3 is a structural exploded view of FIG. 1.

Referring to FIG. 1, FIG. 2, and FIG. 3, FIG. 1 is a schematic structural diagram of a cover plate 2 in a snap-fitted state according to an implementation of the present application. FIG. 2 is a schematic structural diagram of a cover plate 2 in an open state according to another implementation of the present application. FIG. 3 is a structural exploded view of FIG. 1.

In an implementation of the present application, a slide-to-unlock housing cover mechanism mainly includes a cover plate 2, a fixing column 3, a lock shell 4, a handle 5, an unlocking button 6, and an unlocking sliding piece 7.

The cover plate 2 is snap-fitted with a housing 1, and is capable of sliding on the housing 1, so as to realize slidable dismounting and mounting.

The fixing column 3 is vertically disposed on the bottom surface of the housing 1 and protrudes from the bottom surface of the housing 1 by a preset height.

A through hole is formed in the cover plate 2, and the lock shell 4 is mounted in the through hole.

The handle 5 is disposed in the lock shell 4, and is capable of flipping in the lock shell 4, so as to realize mounting and accommodating of the handle 5 in the lock shell 4 or to expose the handle 5 to be grasped by a user for force application.

The unlocking button 6 is mounted in the lock shell 4, mainly for locking of the handle 5 in the lock shell 4 in a natural state (unpressed state), and may be elastically pressed by the user, whereby the handle 5 is unlocked when the pressing is in place, and the handle 5 restores degree of freedom of flipping.

The unlocking sliding piece 7 is disposed in the lock shell 4 and is capable of relatively sliding in the lock shell 4, and the motion direction is kept parallel to a sliding direction of the cover plate 2 on the housing 1. At the same time, one end of the unlocking sliding piece 7 is also sleeved on the fixing column 3.

Thus, when the housing cover needs to be dismounted, the unlocking button 6 is first pressed to unlock the handle 5, and then the user may turn the handle 5 out by flipping the handle 5 outward. At the same time, in the process of flipping the handle 5, the unlocking sliding piece 7 is driven to slide relative to the lock shell 4 by using the handle 5. One end of the unlocking sliding piece 7 is sleeved on the fixing column 3, and the lock shell 4 is connected to the cover plate 2. Therefore, when the user flips the handle 5, the lock shell 4 and the cover plate 2 actually slide on the housing 1, and the unlocking sliding piece 7 is kept stationary through the fixing column 3, thereby realizing sliding disengagement between the cover plate 2 and the housing 1. Finally, the cover body is dismounted in a mode of the unlocking sliding piece 7 being separated from the fixing column 3. When it is necessary to mount the housing cover, the same operation principle is adopted. Details are not described herein.

In conclusion, compared with the traditional technology, the slide-to-unlock housing cover mechanism provided by this embodiment may simplify the structure, may reduce manufacturing costs, and meanwhile, may avoid extra space occupation on the basis that cover plate 2 dismounting and mounting operation is conveniently achieved.

Figure 4:
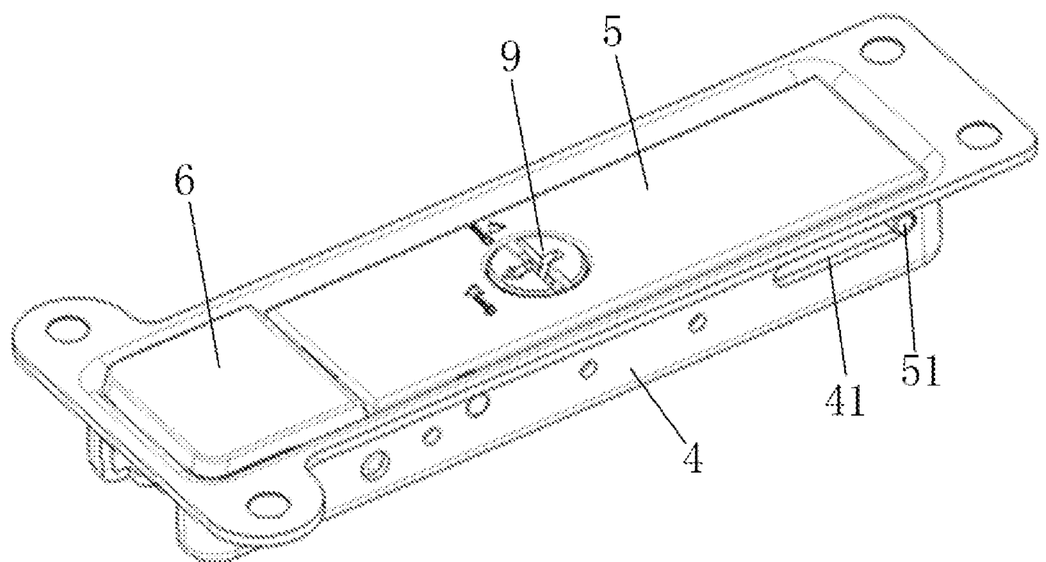
FIG. 4 is an assembly view of a lock shell and related parts.
Figure 5:
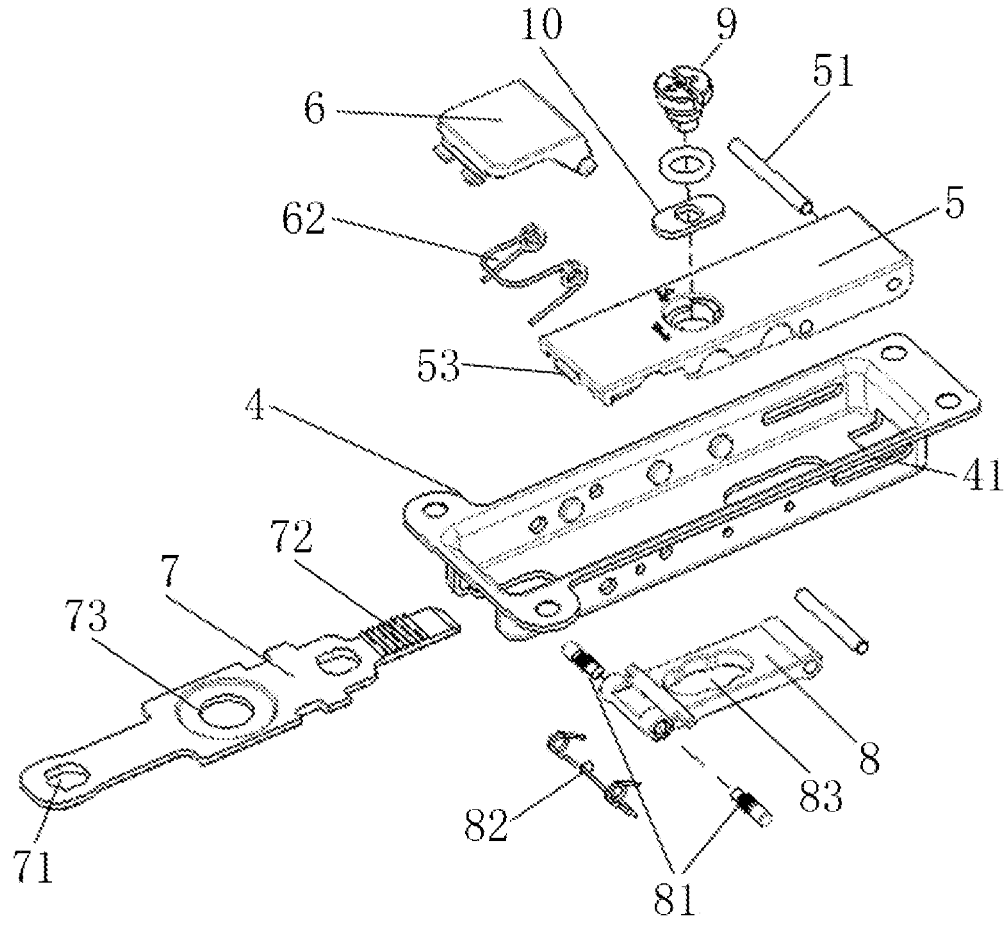
FIG. 5 is a structural exploded view of FIG. 4.
Figure 6:
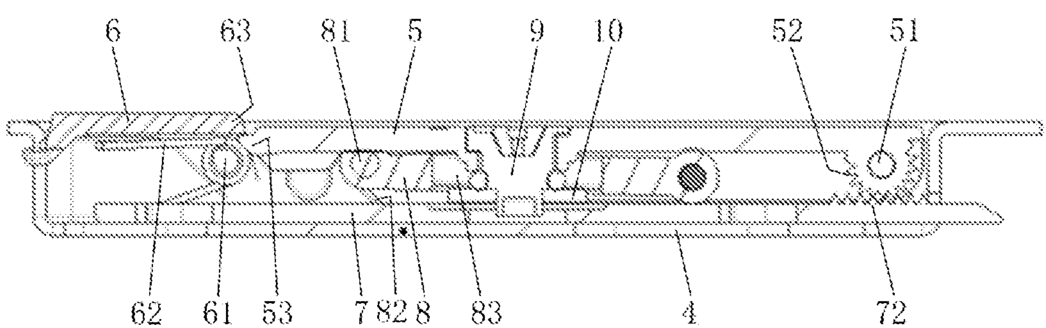
FIG. 6 is a longitudinal sectional view of FIG. 4.

As shown in FIG. 4, FIG. 5, and FIG. 6, FIG. 4 is an assembly view of a lock shell 4 and related parts. FIG. 5 is a structural exploded view of FIG. 4. FIG. 6 is a longitudinal sectional view of FIG. 4.

In an embodiment for the lock shell 4, the lock shell 4 is a groove-shaped piece which has a rectangular shape, and includes an accommodating groove for accommodating components such as the handle 5, the unlocking button 6, the unlocking sliding piece 7, and the support connecting rod 8. In this way, the handle 5 may be conveniently flipped out of the lock shell 4.

In an embodiment for the fixing column 3, the top of the fixing column 3 is elastic, and an elastic column structure is formed. At the same time, a clamping hole 71 is formed in one end of the unlocking sliding piece 7. The clamping hole 71 is mainly configured to form an elastic clamping fit with the top of the fixing column 3, namely a strong shaft hole fit with a slight interference amount. In this way, when the unlocking sliding piece 7 is sleeved into the fixing column 3, the clamping hole 71 may be smoothly sleeved into the fixing column 3 by elastic deformation of the top of the fixing column 3, thereby improving the connection stability and preventing accidental separation.

In an embodiment for the handle 5, in order to facilitate the flipping motion of the handle 5, a handle rotating shaft 51 is disposed at one end of the top of the handle 5 in this embodiment. In one or more embodiments, two ends of the handle rotating shaft 51 are rotationally connected to the inner walls of two sides of the lock shell 4, respectively. At the same time, the gear 52 is also disposed on the handle rotating shaft 51, whereby when the handle rotating shaft 51 rotates, the gear 52 also rotates synchronously. In one or more embodiments, in order to facilitate the driving of the handle 5 to the unlocking sliding piece 7, a rack 72 is disposed at the other end of the unlocking sliding piece 7 in this embodiment. In one or more embodiments, the rack 72 is mainly configured to mesh with the gear 52 on the handle rotating shaft 51, whereby the rotary motion of the handle 5 is converted into the linear motion of the unlocking sliding piece 7 by a gear and rack transmission mechanism.

In addition, a support connecting rod 8 is additionally disposed in this embodiment. In one or more embodiments, one end of the support connecting rod 8 is rotationally connected to the side wall of the lock shell 4, and the other end of the support connecting rod 8 is rotationally connected to the bottom of the handle 5. At the same time, a sliding hole 41 is formed in the side wall of the lock shell 4 in this embodiment. A length direction of the sliding hole 41 is parallel to the sliding direction of the cover plate 2 on the housing 1. Accordingly, the handle rotating shaft 51 is slidably disposed in the sliding hole 41. In this way, when the handle 5 is flipped, the support connecting rod 8 is synchronously flipped to support the handle 5, and the handle rotating shaft 51 slides synchronously in the sliding hole 41 along with the flipping of the handle 5, thus improving the driving stroke and efficiency for the unlocking sliding piece 7.

Further, in order to facilitate the realization of the rotational motion of the support connecting rod 8, a connecting rod rotating shaft 81 is disposed at one end of the support connecting rod 8 in this embodiment. Two ends of the connecting rod rotating shaft 81 are rotationally connected to the inner walls of two sides of the lock shell 4, respectively. At the same time, a connecting rod torsion spring 82 is sleeved on the connecting rod rotating shaft 81 in this embodiment. In one or more embodiments, the connecting rod torsion spring 82 may be crimped and elastically deformed with the rotation of the connecting rod rotating shaft 81. Moreover, in the state where the handle 5 is not flipped, since the handle 5 is pressed against the support connecting rod 8 under the action of gravity (and kept locked by the unlocking button 6), the connecting rod torsion spring 82 accumulates a certain elastic potential energy at this moment. Thus, when the user presses the unlocking button 6 to unlock the handle 5, the elastic potential energy of the connecting rod torsion spring 82 is released, and the support connecting rod 8 is driven to rotate. Then, the support connecting rod 8 is used for supporting or pushing the handle 5, whereby the handle 5 is initially flipped (by a small flipping angle). Accordingly, the handle 5 also drives the unlocking sliding piece 7 to generate a small linear displacement (X1 in the figure) relative to the cover plate 2.

Figure 9:
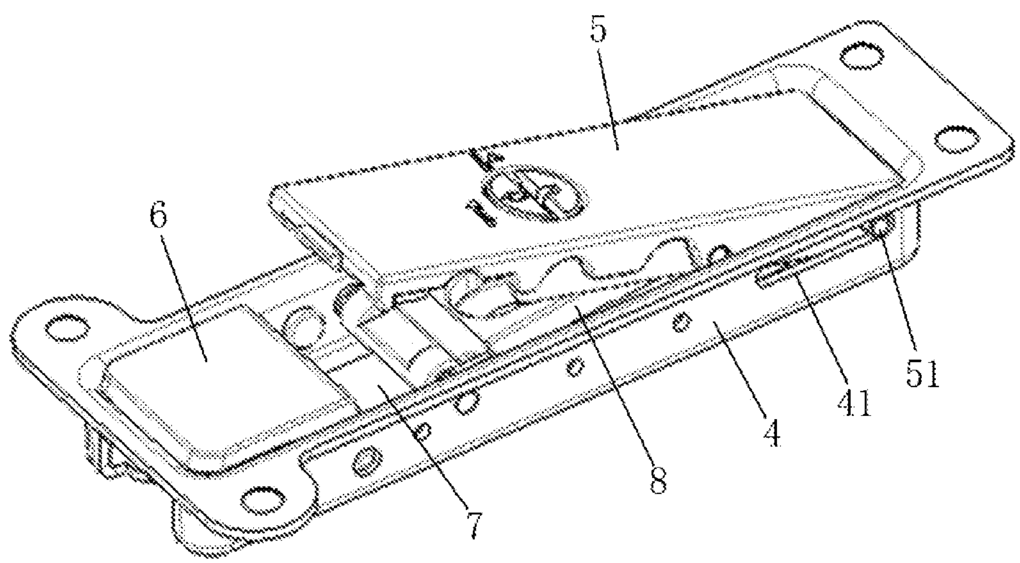
FIG. 9 is a schematic structural diagram of a handle after being flipped for a first time.
Figure 10:
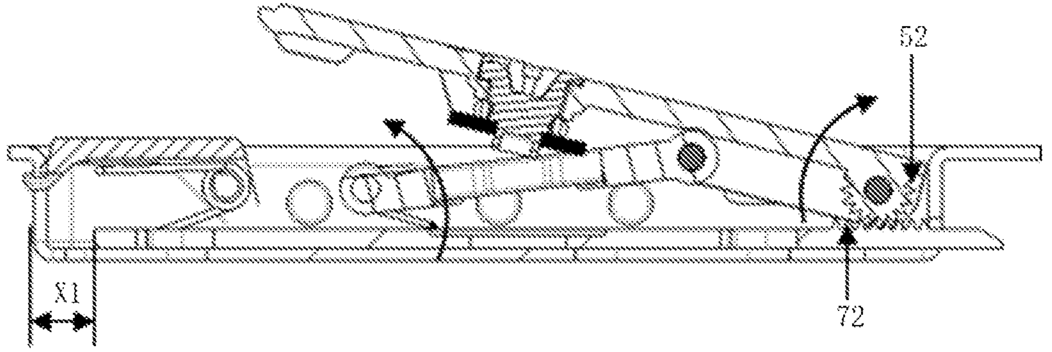
FIG. 10 is a longitudinal sectional view of FIG. 9.

As shown in FIG. 9 and FIG. 10, FIG. 9 is a schematic structural diagram of a handle 5 after being flipped for the first time. FIG. 10 is a longitudinal sectional view of FIG. 9.

It may be seen that when the user presses the unlocking button 6, the handle 5 will automatically pop out of the lock shell 4, whereby the user may grasp the handle conveniently. Compared with the traditional technology in which fingers stretch into the through hole of the cover plate 2 to pull out the handle 5, the operation is more convenient and the operation experience is better in this embodiment.

Figure 11:
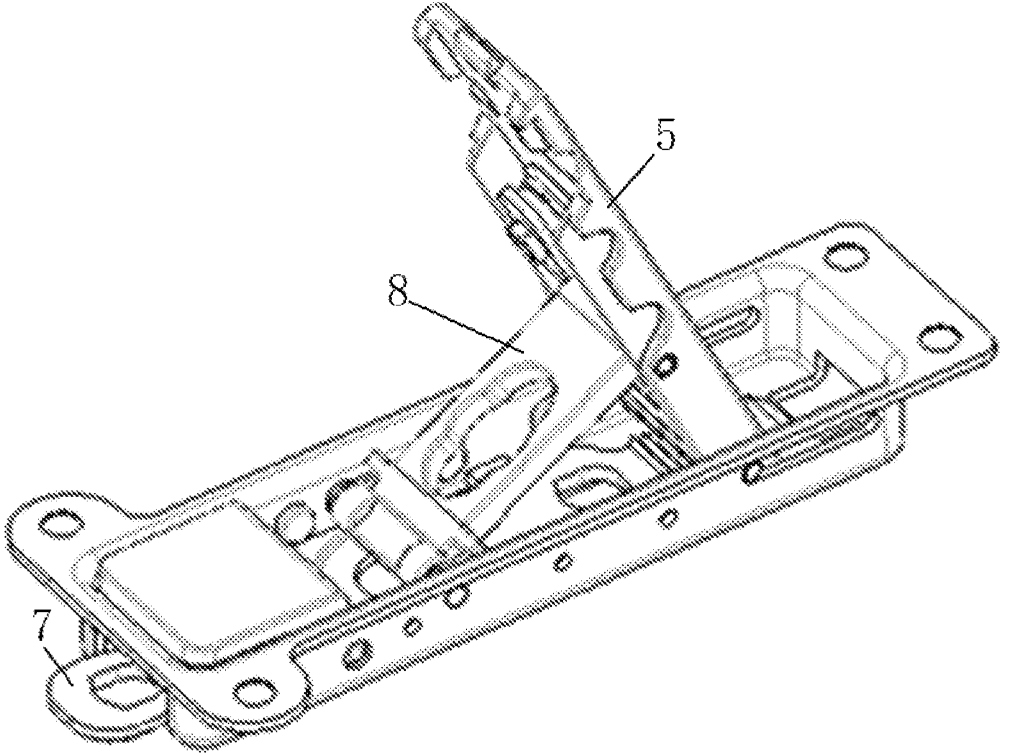
FIG. 11 is a schematic structural diagram of a handle flipped to a limit position.
Figure 12:
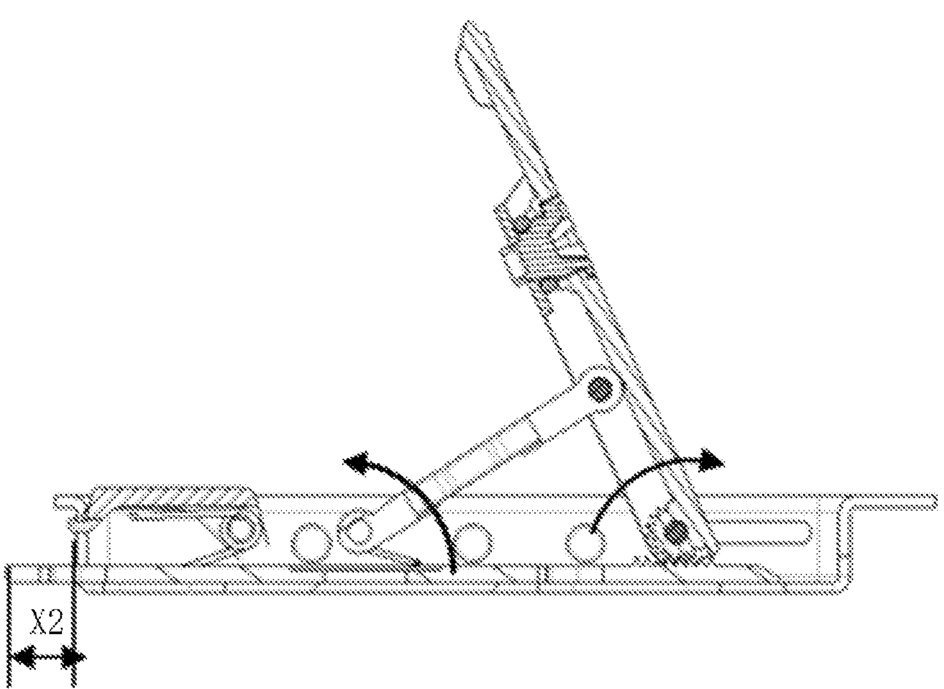
FIG. 12 is a longitudinal sectional view of FIG. 11.

As shown in FIG. 11 and FIG. 12, FIG. 11 is a schematic structural diagram of a handle 5 flipped to a limit position. FIG. 12 is a longitudinal sectional view of FIG. 11.

After the handle 5 automatically pops out, the user may grasp the end of the handle 5 and manually flip the handle, thereby driving the unlocking sliding piece 7 to generate a large linear displacement (X2 in the figure) relative to the cover plate 2. When the cover plate 2 finally slides to a snap-fitted state where the cover plate is separated from the housing 1, the cover plate slides by a distance ΔL relative to the housing 1. It would be obvious that X1+X2=ΔL.

In an embodiment for the unlocking button 6, in order to facilitate the realization of an automatic reset function of the unlocking button 6, a button rotating shaft 61 and a button torsion spring 62 are additionally disposed in this embodiment. The button rotating shaft 61 is disposed at the bottom of the unlocking button 6, and two ends of the button rotating shaft 61 are rotationally connected to the inner walls of two sides of the lock shell 4, respectively. The button torsion spring 62 is sleeved on the button rotating shaft 61, and the operation principle thereof is similar to that of the connecting rod torsion spring 82. The button torsion spring is mainly configured to spring up the unlocking button 6 by an elastic force, whereby the unlocking button 6 may be reset.

Further, in order to improve the locking effect on the handle 5 and prevent accidental unlocking of the handle 5, a wedge-shaped portion 63 is disposed at the end of the unlocking button 6 close to the handle 5. At the same time, an abutment protrusion 53 is also disposed at the end of the handle 5 close to the unlocking button 6 in this embodiment. In one or more embodiments, the abutment protrusion 53 is mainly configured to form an abutment with the wedge-shaped portion 63, so as to lock the handle 5 in the lock shell 4 by an abutment force therebetween. After the unlocking button 6 is pressed, the unlocking button will rotate around the button rotating shaft 61, and the wedge-shaped portion 63 rotates synchronously, whereby the movement space of the abutment protrusion 53 is reserved, and the handle 5 is unlocked.

In another implementation of the present application, in order to strengthen the management of the unlocked and locked states of the handle 5, a secondary locking mechanism is additionally disposed in this embodiment. In one or more embodiments, a via hole is formed in the handle 5, a secondary locking rod 9 is mounted in the via hole, and the secondary locking rod 9 is capable of rotating in the via hole. At the same time, the bottom of the secondary locking rod 9 extends up to the bottom of the lock shell 4 and beyond the bottom surface of the support connecting rod 8, and finally abuts against the surface of the unlocking sliding piece 7. The secondary locking piece 10 is connected to the bottom of the secondary locking rod 9, and is mainly configured to form an abutment locking effect with the bottom surface of the support connecting rod 8. That is, the secondary locking piece 10 abuts against the bottom surface of the support connecting rod 8 to limit the upward movement of the secondary locking rod 9 and further limit the outward flipping of the handle 5. At the same time, a secondary locking hole 83 is formed in the support connecting rod 8, and the secondary locking hole 83 is mainly configured to cooperate with the secondary locking piece 10, whereby the shape of the secondary locking piece 10 is matched with that of the secondary locking hole 83 after rotating synchronously with the secondary locking rod 9 to a certain angle, and then the secondary locking piece 10 may pass through the secondary locking hole 83 to realize the unlocking of the handle 5. At this moment, the secondary locking rod 9 may move up smoothly, and the handle 5 may be flipped out.

Figure 7:
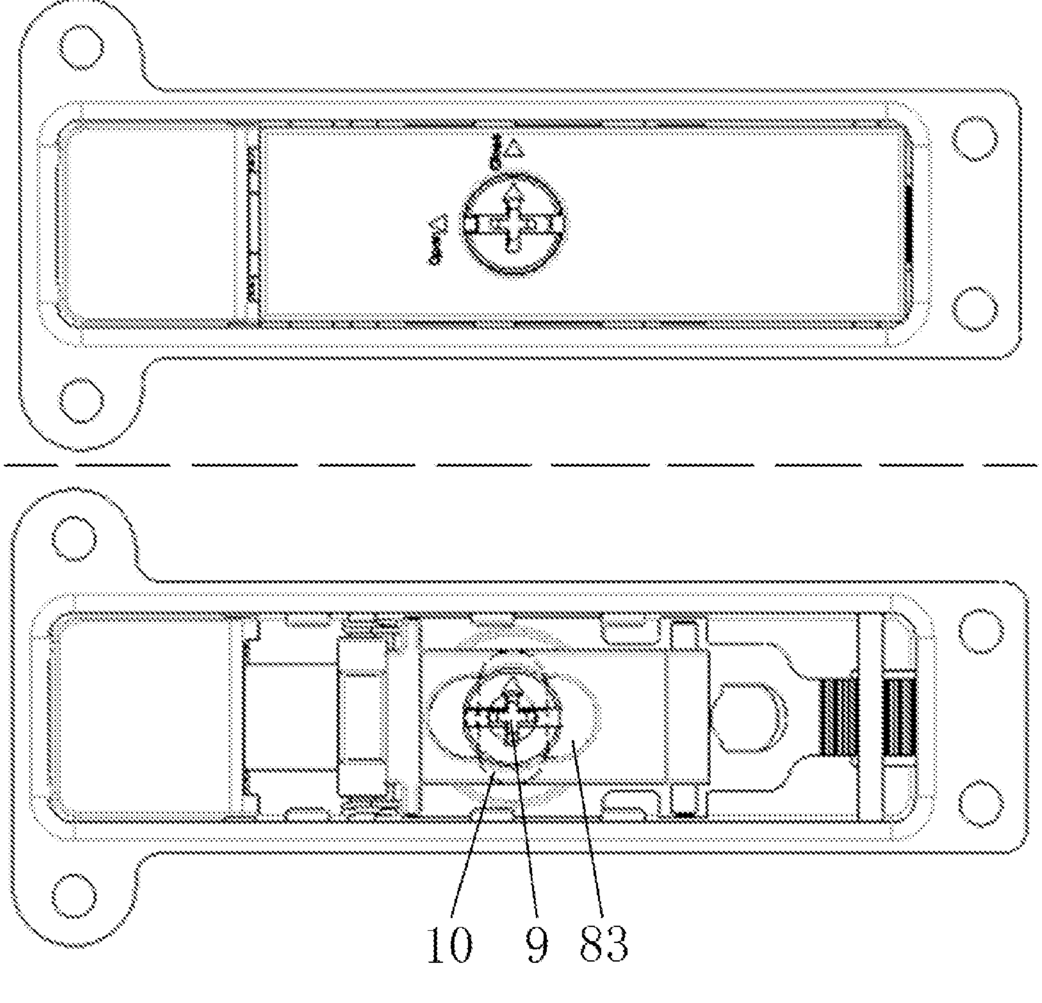
FIG. 7 is a front-top view of a secondary locking piece in a locked state.
Figure 8:
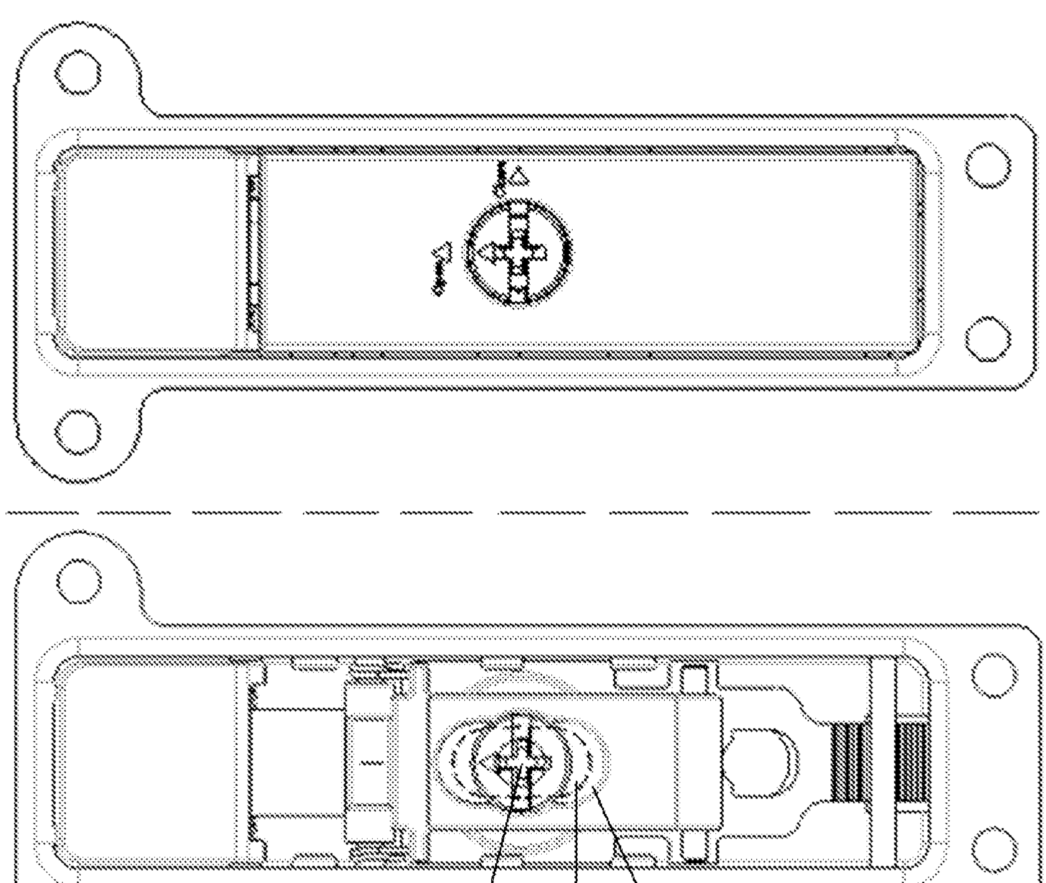
FIG. 8 is a front-top view of the secondary locking piece in an unlocked state.

As shown in FIG. 7 and FIG. 8, FIG. 7 is a front-top view of a secondary locking piece 10 in a locked state, and FIG. 8 is a front-top view of a secondary locking piece 10 in an unlocked state (the handle 5 is omitted in the top views, and the dotted line indicates the position of the secondary locking piece 10).

Generally, the secondary locking hole 83 may be a rectangular hole, and the secondary locking piece 10 may be a rectangular piece of the same shape as that of the rectangular hole, whereby the secondary locking piece 10 may pass through the secondary locking hole 83 when rotating to the same posture as the secondary locking hole 83, while the secondary locking piece 10 may not pass through the secondary locking hole 83 when the secondary locking piece 10 rotates to a 90° or another angle posture with the secondary locking hole 83.

In addition, an annular groove 73 is formed in the surface of the unlocking sliding piece 7 in this embodiment. The annular groove 73 is mainly configured to accommodate the secondary locking piece 10, whereby the secondary locking piece 10 may rotate synchronously with the secondary locking rod 9 in the annular groove 73.

This embodiment further provides a server case, mainly including a housing 1 and a slide-to-unlock housing cover mechanism disposed on the housing 1. The contents of the slide-to-unlock housing cover mechanism are the same as the above related contents, and will not be repeated herein.

The above description of the disclosed embodiments enables those skilled in the art to practice or use the present application. Various modifications to these embodiments will be obvious to those skilled in the art, and the general principles defined herein may be implemented in other embodiments without departing from the spirit or scope of the present application. Therefore, the present application will not be limited to the embodiments shown herein but is intended to conform to the widest scope consistent with the principles and novel features disclosed herein.

The invention claimed is:

1. A slide-to-unlock housing cover mechanism, comprising:

- a cover plate slidably snap-fitted with a housing;
- a fixing column vertically disposed on a bottom surface of the housing;
- a through hole formed in the cover plate;
- a lock shell mounted in the through hole;
- a handle flipped in the lock shell;
- an unlocking button mounted in the lock shell in a pressing mode and configured to lock the handle; and
- an unlocking sliding piece slidably disposed in the lock shell and configured to perform linear motion driven by a flip of the handle;
- a sliding direction of the unlocking sliding piece being parallel to a sliding direction of the cover plate, and a first end of the unlocking sliding piece being sleeved on the fixing column.

2. The slide-to-unlock housing cover mechanism according to claim 1, wherein a top of the fixing column is elastic, and the first end of the unlocking sliding piece is disposed with a clamping hole for forming an elastic clamping fit with the top of the fixing column.

3. The slide-to-unlock housing cover mechanism according to claim 1, wherein a bottom of the handle is provided with a handle rotating shaft rotationally connected to a side wall of the lock shell, the handle rotating shaft is provided with a gear, and a second end of the unlocking sliding piece is provided with a rack for meshing with the gear.

4. The slide-to-unlock housing cover mechanism according to claim 3, further comprising a support connecting rod, wherein

- a first end of the support connecting rod is rotationally connected to the side wall of the lock shell, and a second end of the support connecting rod is rotationally connected to the bottom of the handle; and
- a sliding hole is formed in the side wall of the lock shell, and the handle rotating shaft is slidably disposed in the sliding hole.

5. The slide-to-unlock housing cover mechanism according to claim 4, wherein the first end of the support connecting rod is provided with a connecting rod rotating shaft rotationally connected to the side wall of the lock shell, and

- a connecting rod torsion spring for abutting with a bottom of the lock shell to support the handle by an elastic force is sleeved on the connecting rod rotating shaft.

6. The slide-to-unlock housing cover mechanism according to claim 1, wherein a bottom of the unlocking button is provided with a button rotating shaft rotationally connected to a side wall of the lock shell, and a button torsion spring for abutting with a bottom of the lock shell to spring up the unlocking button by an elastic force is sleeved on the button rotating shaft.

7. The slide-to-unlock housing cover mechanism according to claim 6, wherein an end of the unlocking button close to the handle is provided with a wedge-shaped portion, and an end of the handle close to the unlocking button is provided with an abutment protrusion for cooperating with the wedge-shaped portion to form an abutment.

8. The slide-to-unlock housing cover mechanism according to claim 4, wherein the handle is disposed with a via hole, a secondary locking rod is rotatably mounted in the via hole, a bottom of the secondary locking rod is connected to a secondary locking piece, and the support connecting rod is disposed with a secondary locking hole.

9. The slide-to-unlock housing cover mechanism according to claim 8, wherein a surface of the unlocking sliding piece is disposed with an annular groove for accommodating the secondary locking piece.

10. A server case, comprising a housing and a slide-to-unlock housing cover mechanism disposed on the housing, wherein the slide-to-unlock housing cover mechanism comprises:

a cover plate slidably snap-fitted with the housing;

a fixing column vertically disposed on a bottom surface of the housing;

a through hole formed in the cover plate;

a lock shell mounted in the through hole;

a handle flipped in the lock shell;

an unlocking button mounted in the lock shell in a pressing mode and configured to lock the handle; and an unlocking sliding piece slidably disposed in the lock shell and configured to perform linear motion driven by a flip of the handle;

a sliding direction of the unlocking sliding piece being parallel to a sliding direction of the cover plate, and a first end of the unlocking sliding piece being sleeved on the fixing column.

11. The slide-to-unlock housing cover mechanism according to claim 1, wherein the lock shell is a groove-shaped piece and comprises an accommodating groove.

12. The slide-to-unlock housing cover mechanism according to claim 6, wherein two ends of the button rotating shaft are rotationally connected to inner walls of two sides of the lock shell, respectively.

13. The slide-to-unlock housing cover mechanism according to claim 8, wherein the secondary locking hole is a rectangular hole and the secondary locking piece is a rectangular piece of a same shape as the rectangular hole.

14. The slide-to-unlock housing cover mechanism according to claim 1, wherein the cover plate is connected to the lock shell; and when the unlocking sliding piece is slide relative to the lock shell upon being driven by the handle, the unlocking sliding piece disengages the housing from the cover plate through the fixing column.

15. The slide-to-unlock housing cover mechanism according to claim 1, wherein when the unlocking button is in an unpressed state, the unlocking button locks the handle; and when the unlocking button is in a pressed state, the unlocking button pop the handle out of the lock shell.

16. The slide-to-unlock housing cover mechanism according to claim 4, wherein a length direction of the sliding hole is parallel to the sliding direction of the cover plate.

17. The slide-to-unlock housing cover mechanism according to claim 8, wherein the bottom of the secondary locking rod extends up to a bottom of the lock shell and beyond a bottom surface of the support connecting rod to abut against a surface of the unlocking sliding piece.

18. The slide-to-unlock housing cover mechanism according to claim 8, wherein the secondary locking piece abuts against a bottom surface of the support connecting rod to limit an upward movement of the secondary locking piece, whereby limiting outward flipping of the handle.

19. The slide-to-unlock housing cover mechanism according to claim 18, wherein after the secondary locking piece rotates with the secondary locking rod to a first angle, a shape of the secondary locking piece is matched with a shape of the secondary locking hole to make the secondary locking piece pass through the secondary locking hole.

20. The slide-to-unlock housing cover mechanism according to claim 7, wherein after the unlocking button is pressed, the wedge-shaped portion rotates to provide movement space of the abutment protrusion to unlock the handle.

* * * * *